United States Patent
Hacker et al.

(10) Patent No.: US 6,506,441 B2
(45) Date of Patent: Jan. 14, 2003

(54) NOVOLAC POLYMER PLANARIZATION FILMS WITH HIGH TEMPERATURE STABILITY

(75) Inventors: Nigel Hacker, San Martin, CA (US); Todd Krajewski, Mountain View, CA (US); Richard Spear, San Jose, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/735,838

(22) Filed: Dec. 12, 2000

(65) Prior Publication Data

US 2001/0000515 A1 Apr. 26, 2001

Related U.S. Application Data

(62) Division of application No. 09/205,006, filed on Dec. 2, 1998.

(51) Int. Cl.$^7$ .............................. B05D 5/12; B05D 3/02; G03C 1/76; G03F 7/00
(52) U.S. Cl. ................... 427/96; 427/385.5; 430/271.1; 430/302
(58) Field of Search ............................. 427/96, 385.5; 430/271.1, 302

(56) References Cited

U.S. PATENT DOCUMENTS

| | | | |
|---|---|---|---|
| 3,928,288 A | 12/1975 | Walker | 260/59 |
| 4,731,319 A | 3/1988 | Kohara et al. | 430/192 |
| 4,795,829 A | 1/1989 | Schneller et al. | 568/750 |
| 5,100,758 A | 3/1992 | Tanaka et al. | 430/191 |
| 5,206,348 A | 4/1993 | Jacovich et al. | 534/557 |
| 5,266,440 A | 11/1993 | Zampini | 430/192 |
| 5,276,126 A | 1/1994 | Rogler | 528/155 |
| 5,294,521 A | 3/1994 | Jacovich et al. | 430/326 |
| 5,332,647 A | 7/1994 | Ohno et al. | 430/165 |
| 5,332,648 A | 7/1994 | Kihara et al. | 430/270 |
| 5,348,838 A | 9/1994 | Ushirogouchi et al. | 430/270 |
| 5,372,914 A | 12/1994 | Naito et al. | 430/296 |
| 5,395,728 A | 3/1995 | Jacovich et al. | 430/192 |
| 5,401,605 A | 3/1995 | Doi et al. | 430/192 |
| 5,413,894 A | 5/1995 | Sizensky et al. | 430/165 |
| 5,434,031 A | 7/1995 | Nakao et al. | 430/191 |
| 5,456,995 A | 10/1995 | Ozaki et al. | 430/191 |
| 5,456,996 A | 10/1995 | Ozaki et al. | 430/191 |
| 5,473,045 A | 12/1995 | Sizensky et al. | 528/129 |
| 5,478,692 A | 12/1995 | Doi et al. | 430/191 |
| 5,494,785 A | 2/1996 | Sizensky et al. | 430/326 |
| 5,498,514 A | 3/1996 | Nakao et al. | 430/512 |
| 5,501,936 A | 3/1996 | Hosoda et al. | 430/191 |
| 5,576,138 A | 11/1996 | Ando et al. | 430/191 |
| 5,599,653 A | 2/1997 | Nakao et al. | 430/314 |
| 5,601,961 A | 2/1997 | Nakayama et al. | 430/192 |
| 5,604,077 A | 2/1997 | Kono et al. | 430/192 |
| 5,609,982 A | 3/1997 | Sato et al. | 430/192 |
| 5,629,128 A | 5/1997 | Shirakawa et al. | 430/192 |
| 5,639,587 A | 6/1997 | Sato et al. | 430/190 |
| 5,652,081 A | 7/1997 | Tan et al. | 430/192 |
| 5,667,932 A | 9/1997 | Sato et al. | 430/192 |
| 5,674,657 A | 10/1997 | Tan et al. | 430/191 |
| 5,677,102 A | 10/1997 | Shiihara | 430/168 |
| 5,683,851 A | 11/1997 | Tan et al. | 430/191 |
| 5,686,585 A | 11/1997 | Hishiro et al. | 534/872 |
| 5,693,749 A | 12/1997 | Rahman et al. | 528/482 |
| 5,709,977 A | 1/1998 | Tan et al. | 430/192 |
| 5,728,504 A | 3/1998 | Hosoda et al. | 430/192 |
| 5,731,110 A | 3/1998 | Hishiro et al. | 430/7 |
| 5,739,265 A | 4/1998 | Rahman et al. | 528/482 |
| 5,747,218 A | 5/1998 | Momota et al. | 430/192 |
| 5,750,310 A | 5/1998 | Sato et al. | 430/192 |
| 5,853,954 A | 12/1998 | Rahman et al. | 430/311 |
| 5,858,547 A | * 1/1999 | Drage | 428/451 |
| 5,910,559 A | 6/1999 | Rahman et al. | 528/137 |
| 6,027,853 A | 2/2000 | Malik et al. | 430/270.1 |

FOREIGN PATENT DOCUMENTS

| | | |
|---|---|---|
| EP | 0 144 880 | 6/1985 |
| EP | 0 727 711 | 8/1996 |
| WO | WO 96 02066 | 1/1996 |
| WO | WO 98 27129 | 6/1998 |

OTHER PUBLICATIONS

Tsiartas, et al., "Effect of Molecular Weight Distribution on the Dissolution Properties of Novolac Blends", SPIE vol. 2438, pp. 261–271, Jun. 1995.

Allen, et al., "Performance Properties of Near–Monodisperse Novolak Resins", SPIE vol. 2438, pp. 250–260, Jun. 1995.

* cited by examiner

*Primary Examiner*—Tae H. Yoon
(74) *Attorney, Agent, or Firm*—Rutan & Tucker, LLP; Sandra P. Thompson; Robert D. Fish

(57) ABSTRACT

A process for forming a planarization film on a substrate that does not smoke or fume on heating includes applying a polymeric solution including a novolac resin having a weight average molecular weight between about 1000 and 3000 amu, which has been fractionated to remove molecules with molecular weight below about 350 amu, a surfactant selected from a group consisting of a non-fluorinated hydrocarbon, a fluorinated hydrocarbon and combinations thereof, and an optional organic solvent to a substrate, followed by heating the substrate.

17 Claims, No Drawings

NOVOLAC POLYMER PLANARIZATION FILMS WITH HIGH TEMPERATURE STABILITY

RELATED APPLICATION

This application is a division of U.S. application Ser. No. 09/205,006, filed Dec. 2, 1998.

BACKGROUND OF THE INVENTION

1. Field of the Invention

This invention relates generally to novolac polymer planarization films for microelectronic devices, such as integrated circuits, and more specifically to planarization films with high temperature stability.

2. Description of the Related Art

Novolac polymers have been used extensively in the manufacture of integrated circuits and other semiconductor and microelectronic devices. In particular, photoresists used for microlithographic patterning of semiconductor structures often contain anovolac component along with a photosensitive agent. See, for example, U.S. Pat. No. 5,601,961 to Nakayama et al.

In addition, novolac polymers are also components of planarizing films used in the fabrication of microelectronic devices to provide a relatively flat surface. See, for example, U.S. Pat. No. 5,276,126 and references therein. As the characteristic feature size on such devices becomes smaller, planarizing films are increasingly important in the device fabrication process. Low weight average molecular weight novolac polymers, i.e. those ranging between about 200 and about 2300 atomic mass units (amu) have been found to be useful in forming planarizing films because they tend to flow more readily than polymers having higher molecular weights.

In a typical process of forming a planarization film, a solution containing a novolac polymer is formulated with a surfactant. The surfactant-containing polymer solution is applied to a substrate by conventional spinning techniques. The polymer solution-coated substrate is heated to evaporate any residual solvent present in the film material and to reduce the viscosity of the film. The reduced viscosity causes the material to flow and enhances leveling of the film on the substrate. One difficulty in using these novolac polymer formulations to form planarizing films is that fuming may be observed on heating. Thermally volatilized material is detrimental in that it may form particles that can lead to defects in the manufactured devices and may clog vacuum lines.

It would be desirable to provide a process of forming a planarizing film from a novolac polymer material that retains the excellent planarization of previous materials but does not fume or smoke on heating.

SUMMARY OF THE INVENTION

In accordance with this invention, a process of forming a planarizing film on a substrate is provided, the process including first applying to the surface of the substrate a solution including a novolac resin having a weight average molecular weight between about 1000 and 3000 amu and wherein the novolac resin is fractionated to remove the molecules with molecular weight below about 350 amu and a surfactant selected from a group consisting of a non-fluorinated hydrocarbon, a fluorinated hydrocarbon and combinations thereof. The process additionally includes heating the solution-covered substrate to form a planarized film.

According to another aspect of the present invention, a substrate having a planarized film applied thereon is provided, the film comprising a novolac resin having a molecular weight between about 1000 and 3000 amu and wherein the novolac resin is fractionated to remove the molecules with molecular weight below about 350 amu and a surfactant selected from the group consisting of a non-fluorinated hydrocarbon, a fluorinated hydrocarbon and combinations thereof.

In yet another embodiment of the invention, there is provided a composition for use in the formation of planarizing films on substrates, the composition comprising the fractionated novolac resin as described above, a surfactant selected from the group consisting of a non-fluorinated hydrocarbon, a fluorinated hydrocarbon and combinations thereof, and an optional organic solvent. The novolac resins used in the composition according to the present invention are fractionated by extraction techniques such as column extraction, liquid-liquid extraction, or supercritical fluid extraction to remove the fraction with molecular weight below about 350 amu.

Using the composition according to the present invention in forming planarizing films, no fuming or smoking is observed during the process of heating a coated substrate.

DESCRIPTION OF THE PREFERRED EMBODIMENTS

The process of forming a planarizing film according to this invention uses a composition including a novolac resin that has been fractionated to remove low molecular weight components and a surfactant. Novolac polymers and surfactants that can be used in this invention are described in detail in U.S. application Ser. No. 08/271,291, entitled "Novolac Polymer Planarization Films for Microelectronic Structures", (denoted the '291 application), now U.S. Pat. No. 5,595,547 which is commonly assigned with the present application and is incorporated herein by reference.

As described above, novolac polymers with low molecular weights are especially useful in forming planarizing films because they tend to flow more readily than polymers having higher molecular weights. Polymer molecular weight, as used here, refers to weight average molecular weight, as determined, for example, by gel permeation chromatography, calibrated against polystyrene. According to the present invention, it has been determined that the lowest molecular weight fraction, that is those novolac molecules with molecular weight less than about 350 amu are thermally volatilized when the formulation containing novolac polymers is heated in forming planarizing films. Thus removal of the lowest molecular weight fraction overcomes the problem of fuming or smoking on heating a coated substrate.

Novolac polymers are commercially available or may be derived from reacting phenols or derivatives therefrom, such as ortho-, meta- and para cresol, with formaldehyde or with other aldehyde compounds. The lowest molecular weight fraction can be substantially removed by extraction techniques such as toluene extraction, column extraction, liquid-liquid extraction, and supercritical fluid extraction.

In the toluene extraction process, solid novolac resin is combined with toluene and heated to between approximately 75 and 80° C. The toluene is decanted and a second lot of toluene is added; the mixture is heated; and the toluene is decanted. The remaining solid is a novolac polymer with the lowest molecular weight fraction reduced. An alternative extraction process, column extraction, is performed on a mixture of polymer resin ground to a fine powder and dry silica gel, installed in a glass column. The mixture in the column is eluted with a first solvent mixture, for example, an ethyl acetate and hexane mixture, until a large volume of elution solvent is obtained, capturing the low molecular weight components. The column is then eluted with a second solvent, for example, methanol, from which the novolac polymer with the lowest molecular weight fraction removed is recovered.

In the liquid-liquid extraction process, the novolac polymer is combined with two solvents with different polarity, for example, ethyl acetate and hexane, and mixed with a sonicator. The contents separate into two phases; the polymer with the lowest molecular weight fraction removed is recovered from the bottom layer. A supercritical fluid extraction technique can also be used. In this process, flows of a polar solvent, such as ethyl acetate, ethanol, or methanol, and $CO_2$ are passed over a novolac polymer sample in an extractor vessel, heated to temperatures in the range between about 60 and 65° C. and pressurized to about 200 to 300 bar. The remaining novolac polymer in the vessel is depleted of the low molecular weight component.

As reported in detail in the appended examples, extraction using the above techniques results in a novolac polymer with increased molecular weight and narrowed polydispersity. Polydispersity is defined as the ratio of the weight average molecular weight to the number average molecular weight. For example, extraction of the phenolic novolac denoted SD-333A, provided by Borden Chemical, Inc. increases the molecular weight from about 900 to between about 1300 and 1800, and decreases polydispersity from over 1.5 to less than 1.4, depending on the extraction method. The molecular weight distribution of molecules that make up the novolac resin may be determined using gel permeation chromatography (GPC). High performance liquid chromatography (HPLC) is used to determine the removal efficiency of the low molecular weight material that causes fuming. Fractionation reduces the contribution in HPLC area per cent of molecules with molecular weight less than about 200 from over 20% to less than about 4% of the total molecular weight distribution and reduces the contribution of molecules with molecular weight less than about 350 from over 30% to less than about 10%. Furthermore, fractionation improves thermal stability of the novolac polymers as evidenced by increase in the glass transition temperature and decrease in the weight loss on heating.

Thus, the novolac polymers used in this invention are specified by their weight average molecular weight and by the fraction of molecules with molecular weight less than about 350, i.e. the lowest molecular weight fraction, remaining after fractionation. Novolac polymers with molecular weight between about 900 and about 2500, and preferably between about 1200 and 2300, and with the lowest fraction less than about 22%, and, preferably, less than about 15% are advantageously used.

The fractionated novolac polymer can be combined with a surfactant in formulating a coating solution for forming planarizing films. As described in the '291 application, surfactants suitable for this invention include non-fluorinated and fluorinated hydrocarbons and mixtures thereof. Suitable non-fluorinated hydrocarbon surfactants may be comprised of alkylated derivatives of organic acids and esters thereof having from about 5 to about 50 carbons, preferably from about 10 to about 30 carbons and combinations thereof. Suitable fluorinated hydrocarbon surfactants may be comprised of alkylated derivatives of organic acids and esters thereof having from about 5 to about 50 carbons, preferably from about 10 to about 30 carbons, and at least one carbon-fluorine bond, and combinations thereof. More specifically, particular fluorinated hydrocarbon surfactants include fluoroaliphatic oxyethylene adducts, fluorinated alkyl alkoxylates and sulfonamides containing from about 50 to about 20 carbon atoms, fluoroaliphatic polymeric esters derived from monomers comprised of partially fluorinated hydrocarbon chains containing from about 50 to about 20 carbon atoms with terminal ester groups attached thereto, fluoroaliphatic copolymers derived from monomers comprised of partially fluorinated hydrocarbon chains containing from about 5 to about 20 carbon atoms with terminal functional groups selected from esters and acids attached thereto, and combinations thereof. These fluorinated surfactants are commercially available from 3M.

An organic solvent may optionally be included as a third component of the coating solution. Solvents suitable for this invention include aliphatic and aromatic hydrocarbons, alcohols, ketones, ester, ethers, ether alcohols, ether esters, alcohol esters, ketone esters, ketone ethers, ketone alcohols, amides, nitriles, and combinations thereof. More specifically, particular solvents include ethyl lactate, ethyl acetate, propyl acetate, butyl acetate, and combinations thereof.

The polymeric solution preferably contains from about 1 to about 90 percent, more preferably between from about 10 to about 50 percent, and most preferably from about 20 to about 40 percent, based upon the total weight of the solution, of the novolac polymer, and preferably from about 0.01 to about 5 percent, more preferably from about 0.1 to about 1 percent, and most preferably from about 0.3 to about 0.7 percent of surfactant. The optional solvent may be present in an amount ranging between about 10 to about 90 percent, preferably between about 50 to about 90 percent, and most preferably between about 60 to about 85 percent.

The polymeric solution may be applied to the substrate by any conventional means, such as spin-coating. Preferably, the solution is centrally applied to the substrate, which is then spun at speeds ranging between about 500 and about 6000 rpm, preferably between about 1500 and about 4000 rpm, for about 5 to about 60 seconds, preferably about 10 to about 30 seconds. Optionally, an additional, short, lower speed spin, between about 400 and 600 rpm for about 1 to about 5 seconds is used to spread the solution immediately after application.

Typically, the compositions of this invention are applied onto wafer substrates, such as silicon wafers which have a circuit pattern on their surface, to be processed into integrated circuits or other microelectronic devices.

The coated substrate is then heated by any conventional means. Preferably, the substrate is heated by placing it on a hot plate to heat the wafer from below. Typically, this is done commercially via a conventional integrated spin-coater/hot plate system. The coated substrate is typically heated for about 0.5 minutes to about 5 minutes at temperatures ranging between about 50° C. and about 300° C., preferably between about 100° C. and 200° C. Alternatively, multiple hot plates, i.e. between about 2 and about 5 hot plates, may be used, with the same time and temperature ranges applying, and where the temperature of each subsequent hot plate is higher than the temperature of the previous one.

As illustrated in the following examples, no fumes are observed when formulations containing fractionated novolac polymers, according to the present invention, are coated on substrates and heated as described above to form a planarized film.

EXAMPLES

Preparation of fractionated novolac polymers by toluene extraction, liquid-liquid extraction, column extraction, and supercritical fluid extraction is given in Examples 1–4, respectively. The phenolic novolac polymer, SD-333A, provided by Borden Chemical, Inc. was used in these examples. Characterization methods and properties of the fractionated polymers obtained in Examples 1–4 are given in Examples 5 and 6. The original phenolic novolac polymer and the fractionated polymers are formulated with a surfactant and solvent to form coating solutions. Formulation and performance of the coating solutions are reported in Example 7.

Example 1

Solid chunks of novolac polymer (206.5 g) were combined with 8 liters of toluene in a 12 liter round bottomed flask and heated to 75–80° C. with stirring for 75 minutes. The solid melted above 55° C. The toluene was decanted and a second lot of 8 liters of toluene added, heated with stirring for 75 minutes, and decanted. The solid remaining in the flask was dissolved in methanol, roto-evaporated until a fluffy pink solid was obtained and dried overnight in a vacuum oven at 45° C. (88.5 g).

Example 2

Novolac polymer (182.34 g) was placed in a 12 liter round bottom flask. The solvent mixture 30% ethyl acetate/70% hexane, by volume, B & J brand ethyl acetate, Fisher Optima grade hexane, (10 liters) was added to the flask and the contents mixed with stirring for 4 hours. After thorough mixing, the contents separated into two phases, a dark viscous bottom layer and a cloudy white top layer. The bottom layer, containing the fractionated novolac polymer, was separated and the solvent removed by roto-evaporation. The yield was 49.6 g (27.2%).

Example 3

Solid novolac polymer ground to a fine powder (300 g) was mixed with 1200 g of dry silica gel. A 2 inch layer of clean silica gel, slurried with 30% ethyl acetate/70% hexane, was installed in a large glass column (3 ⅞ inch×48 inches). The polymer/silica gel mix slurried with the same solvent was installed over the silica gel. The column was eluted with 30% ethyl acetate/70% hexane until 15 liters of elution solvent was collected. The column was next eluted with methanol and three 4 liter fractions were collected. The first two fractions were roto-evaporated until a solid was obtained: first fraction (153.4 g), second fraction (7.1 g) for a total yield of 160.5 g.

Example 4

Novolac polymer (19.3 g) was placed in a 50 cc sample cartridge and inserted in a 30 cc extractor vessel of a Marc Sims Dense Gas Management System, "supercritical fluid extraction apparatus", fitted with an Alltech model 426 standard HPLC pump for solvent addition. The extractor vessel was purged with $CO_2$ (Air Products, SFC grade) for 10 minutes at a flow rate of about 2 g/min and heating started. The flow was then stopped and heating continued until the operating temperature of 60–61° C. was obtained. During heating the HPLC pump was primed with ethyl acetate (B&J brand). Pressure in the extractor vessel was 50–250 bar.

Extraction was performed in two stages. The first stage was started with $CO_2$ and ethyl acetate flows of 9.2–9.4 g/min and 1.0 ml/min, respectively at a pressure of 250 bar. After 3597 g of $CO_2$ passed through the extractor, the temperature was increased to 62° C. After an additional 4023 g of $CO_2$ passed through the extractor, the temperature was increased to 64–65° C., at which temperature, 4500 g of $CO_2$ were passed through the reactor. For the second stage, flows of 9.6–9.8 g/min and 3.0 ml/min of $CO_2$ and ethyl acetate, respectively, were maintained until 2057 g of $CO_2$ had passed through the extractor. The vessel temperature was maintained at 62–63° C. throughout the second stage. The yield of fractionated novolac polymer was 11.29 g.

Example 5

Weight average molecular weight ($M_w$) and number average molecular weight ($M_n$) were determined by gel permeation chromatography (GPC) with respect to polystyrene. Glass transition temperature was determined by differential scanning calorimetry (DSC). The DSC measurement procedure included a 1 minute preheat at 250° C. to remove any residual solvent, followed by a temperature scan from 25° C. to 200° C. at a rate of 10° C./minute. Thermal weight loss was determined by thermal gravimetric analysis (TGA), in which sample weight was recorded as the temperature was raised from 30° C. to 300° C. at a rate of 10° C./minute. Final weight differential is recorded below in Table 1.

TABLE 1

Characterization of Resin Material

| Material | $M_w$ | $M_n$ | Polydispersity | $T_g$(° C.) | % Wt Loss |
|---|---|---|---|---|---|
| Unfractionated | 936 | 606 | 1.544 | 36.6 | 27.2 |
| Example 1 | 1436 | 1055 | 1.361 | 72.4 | 15.2 |
| Example 2 | 1730 | 1246 | 1.388 | 76.4 | 13.9 |
| Example 3 | 1364 | 1072 | 1.273 | 73.8 | 13.4 |
| Example 4 | 1301 | 916 | 1.419 | 64.9 | 13.0 |

Example 6

Results of High Performance Liquid Chromatography (HPLC) analysis, obtained with a Hewlett-Packard HPLC Model 1100 are reported below in Table 2. Area percent for peaks corresponding to specific molecular weights are given. Equal detector response for all molecular weights is assumed.

TABLE 2

Characterization of Resin Material - HPLC Data

| Material | $M_w \approx 200$ (area %) | $M_w \approx 306$ (area %) |
|---|---|---|
| Unfractionated | 22.47 | 9.11 |
| Example 1 | 3.05 | 4.67 |
| Example 2 | 3.94 | 3.22 |
| Example 3 | 0.08 | 4.13 |
| Example 4 | 1.32 | 6.50 |

Example 7

Unfractionated novolac polymer resin and the fractionated polymers from Examples 1–4b were combined with the surfactant, the fluorinated ester derivative denoted FC-430, provided by 3M, and the solvent, ethyl lactate, to form coating solutions with the listed % solids and % solvent. 2–4 ml of the solution were dispensed at the center of 4 inch bare silicon wafers. The wafers were spun at 500 rpm for 2 seconds followed by a 20 second spin at 4000 rpm. The wafers were baked on a hot plate at 200° C. for 120 seconds. Observations are given below in Table 3.

TABLE 3

Performance of Coating Composition

| Material | % Solid | % Solvent | Thickness (Å) | Smoke Observation |
|---|---|---|---|---|
| Unfractionated | 20.35 | 79.45 | 4253 | Heavy for first 20 seconds |
| Unfractionated | 36.82 | 62.98 | 14802 | Heavy for first 60 seconds |
| Example 1 | 17.8 | 81.75 | 4323 | None |
| Example 1 | 31.8 | 67.75 | 14523 | None |
| Example 2 | 17.8 | 81.75 | 4261 | None |
| Example 2 | 31.8 | 67.75 | 13977 | None |
| Example 3 | 15.8 | 83.75 | 3875 | None |
| Example 3 | 29.8 | 69.75 | 14785 | None |
| Example 4 | 17.8 | 81.75 | 4136 | None |
| Example 4 | 31.8 | 67.75 | 13550 | None |

As evidenced by the increase in glass transition temperature and decrease in thermal weight loss reported in Table 1, fractionation results in a novolac polymer resin with increased thermal stability. The results in Table 3 clearly demonstrate that using the coating composition with fractionated novolac polymer resin, according to the present invention, no smoking or fuming is observed during the process of heating a coated substrate.

What is claimed is:

1. A process of forming a planarized film on a substrate comprising:
   applying to a surface of the substrate a polymeric planarizing solution comprising a novolac resin having a weight average molecular weight between about 1000 and 2300 amu, wherein the novolac resin is fractionated to remove the molecules with molecular weight below about 350 amu to less than about 22% of a total molecular weight distribution and further has a polydispersity of less than 1.4 and a surfactant selected from the group consisting of a non-fluorinated hydrocarbon, a fluorinated hydrocarbon and combinations thereof to form a coated substrate; and
   heating said coated substrate to form a planarized film on the surface.

2. The process of claim 1, wherein the solution further comprises an organic solvent.

3. The process of claim 2, wherein the organic solvent comprises at least one of ethyl lactate, ethyl acetate, propyl acetate, and butyl acetate.

4. The process of claim 1, wherein said novolac resin has a fraction with molecular weight below about 350 amu that is less than about 15% of the total.

5. The process of claim 1, wherein said novolac resin is a phenolic resin.

6. The process of claim 1, wherein said novolac resin has a polydispersity of less than about 1.2.

7. The process of claim 1, wherein the surfactant is an ester derivative of a fluorinated hydrocarbon.

8. The process of claim 1, wherein applying to a surface a polymeric planarizing solution further comprises spin-coating the solution onto the surface.

9. The process of claim 1, wherein heating the coated substrate comprises heating the substrate by placing it on a hot plate.

10. The process of claim 9, wherein the coated substrate is placed on the hot plate for about 0.5 to 5 minutes.

11. The process of claim 9, wherein the coated substrate is placed on the hot plate at a temperature range of between 50° C. and 300° C.

12. The process of claim 11, wherein the temperature range is between 100° C. and 200° C.

13. The process of claim 1, wherein the substrate comprises silicon.

14. The process of claim 13, wherein the substrate comprises a circuit pattern on the surface of the substrate.

15. An integrated circuit formed by the process of claim 14.

16. A microelectronic device formed by the process of claim 1.

17. A planarized film formed by the process of claim 1.

* * * * *